United States Patent [19]

Mattox et al.

[11] Patent Number: 4,801,350

[45] Date of Patent: Jan. 31, 1989

[54] METHOD FOR OBTAINING SUBMICRON FEATURES FROM OPTICAL LITHOGRAPHY TECHNOLOGY

[75] Inventors: Robert J. Mattox, Tempe; Frederick J. Robinson, Scottsdale, both of Ariz.

[73] Assignee: Motorola, Inc., Schaumburg, Ill.

[21] Appl. No.: 947,069

[22] Filed: Dec. 29, 1986

[51] Int. Cl.⁴ .................. B44C 1/22; C03C 15/00; H01L 21/306

[52] U.S. Cl. .................. 156/643; 156/646; 156/650; 156/651; 156/653; 156/662; 156/659.1

[58] Field of Search .............. 156/650, 651, 653, 662, 156/646, 644, 659.1, 643

[56] References Cited

U.S. PATENT DOCUMENTS

| | | | |
|---|---|---|---|
| 4,211,582 | 7/1980 | Horng et al. | 156/644 |
| 4,256,514 | 3/1981 | Pogge | 156/657 |
| 4,453,305 | 6/1984 | Janes et al. | 156/651 |
| 4,495,025 | 1/1985 | Haskell | 156/648 |
| 4,534,824 | 8/1985 | Chen | 156/648 |
| 4,589,952 | 5/1986 | Behringer et al. | 156/657 |
| 4,645,564 | 2/1987 | Morie et al. | 156/651 |
| 4,690,729 | 9/1987 | Douglas | 156/657 |
| 4,707,218 | 11/1987 | Giammarco et al. | 156/646 |

Primary Examiner—David L. Lacey
Assistant Examiner—Lori-Ann Johnson
Attorney, Agent, or Firm—Joe E. Barbee

[57] ABSTRACT

A method for the construction of submicron features using optical lithography technology. A material is deposited on a surface to be etched, this material is partially etched through using optical lithography technology. Sidewalls are deposited to reduce the size of this etched area to the submicron size desired. The etch of the layer is then completed resulting in a submicron mask for the substrate below.

3 Claims, 1 Drawing Sheet

METHOD FOR OBTAINING SUBMICRON FEATURES FROM OPTICAL LITHOGRAPHY TECHNOLOGY

BACKGROUND OF THE INVENTION

The present invention pertains to a method for the fabrication of features with a submicron width, such as trenches which are commonly used for the isolation of components on chips. In prior art the method of producing submicron features employs E beam lithography. While the E beam can be used to produce submicron features it is a very expensive process due to the cost of the E beam equipment. The use of an E beam also results in a very low through-put due to its slow process speed.

Other processes for producing submicron features involving conventional optical techniques require many steps, complicating and slowing the processing down.

SUMMARY OF THE INVENTION

The present invention pertains to a method for obtaining submicron features from optical lithography technology. The method involves laying a layer of material on the surface to be etched then partially etching through this layer with optical technology to produce a trench. An oxide layer is then deposited on the surface of this layer to form sidewalls in the trench etched. The thickness of these sidewalls can be varied to produce the desired submicron width of the trench. This oxide layer is then anisotropically etched, leaving only the sidewalls in the trench. This acts as a mask for the etching of the material beneath which, when etched, is of the desired dimension. This then acts as a mask for the surface below.

It is an object of this invention to provide a new and improved method for the fabrication of submicron features.

It is a further object of this invention to provide an inexpensive and easy way to form submicron features.

It is a further object of this invention to provide a means for the inexpensive and easy production of large numbers of test samples which are required in research and development.

These and other objects and advantages of this invention will become apparent to those skilled in the art upon consideration of the accompanying specification, claims, and drawings.

DESCRIPTION OF THE PREFERRED EMBODIMENT

Figure 1:
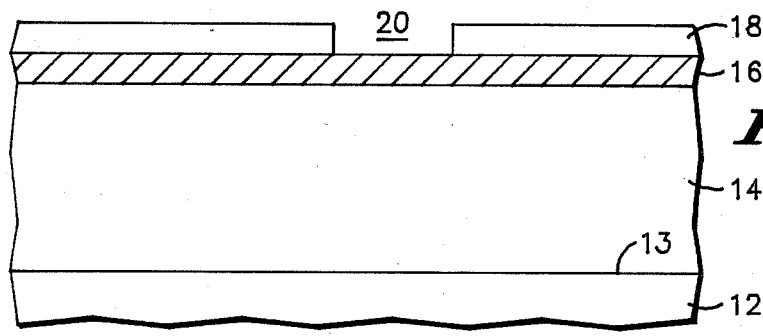
FIGS. 1-5 are enlarged fragmentary cross-sectional views of a wafer showing the steps involved in the fabrication of a submicron feature.

FIG. 1 is a cross-sectional side view of a wafer 10 showing a substrate 12. Substrate 12 can be a semiconductor material such as silicon. A designated portion of surface 13 of substrate 12 is covered by a masking material 14, which may be an organic material for ease in use and in etching. An oxide layer 16 is deposited over layer 14 to protect and to separate layer 14 from a photo resist layer 18 which is formed on the surface of layer 16. It should be noted that layer 16 could be omitted if a material that does not need protection such as a nitride was used in layer 14. Using optical lithography technology resist layer 18 is exposed and etched to form the desired features such as a trench or a hole 20.

Figure 2:
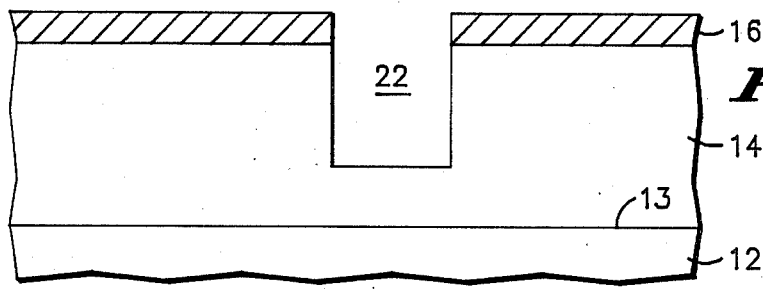

Using layer 18 as a guide the oxide layer 16 is etched and the organic layer 14 is partially etched, as shown in FIG. 2. The resist layer 18 is then removed leaving a feature 22 etched through the oxide layer 16 and partially through organic layer 14.

Figure 3:
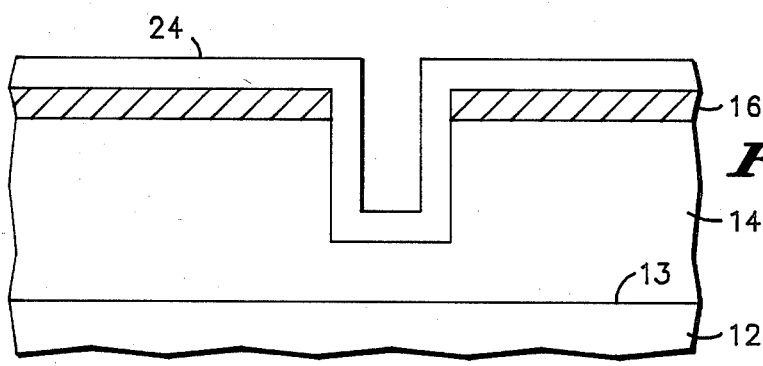

In FIG. 3 an oxide is deposited over etched area 22 resulting in a uniform oxide layer 24 covering the surfaces of the feature.

Figure 4:
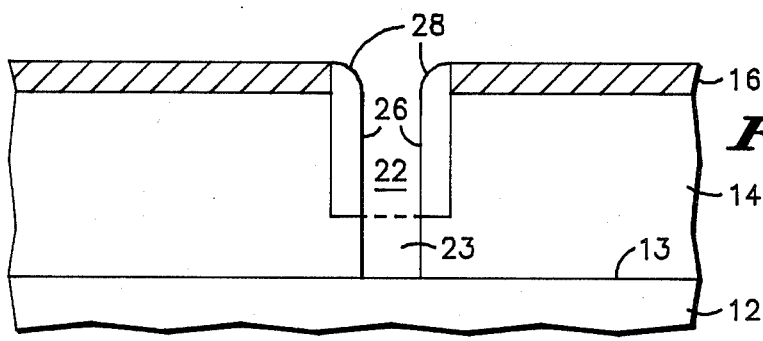

FIG. 4 shows the wafer 10 after an anisotropic etch has removed most of the oxide layer 24 leaving sidewalls 26. The introduction of sidewalls 26 is what reduces feature 22, formed by optical lithographic technology, down to the desired submicron size. When a smaller size feature is required, a greater amount of oxide layer 24 is deposited, resulting in thicker sidewalls 26 which further reduces the size of feature 22. As shown in FIG. 4 when the organic etch is completed and completed section of the etched area 23 is of the reduced size.

Figure 5:
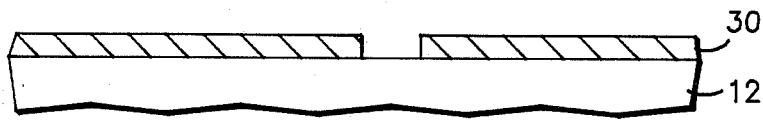

The organic layer may now act as a mask for the etching of substrate 12 or, as shown in FIG. 5, used to etch an oxide layer 30 which will act as a mask on substrate 12. The organic material is then removed in a water resist strip as in a lift-off process. It should be seen by one skilled in the art that this additional oxide layer 30 may be by-passed and the organic layer 14 used to act as a mask directly on a substrate.

Sidewalls 26 must be a minimum height to insure straight sidewalls due to a slight curvature, as shown by the number 28 in FIG. 4, formed during the anisotropic etch. Thus, sidewalls 26 must extend down far enough to become straight but not far enough to extend completely through organic layer 14.

There is thus provided by the present invention a new and improved method for the fabrication of submicron features. Since the method employs optical lithography technology with very few steps, it is very quick and inexpensive. It also allows for large quantities of samples to be produced.

Thus, while we have shown and described specific embodiments of this invention, further modifications and improvements will occur to those skilled in the art. We desire it to be understood, therefore, that the invention is not limited to the particular form shown and we intend in the appended claims to cover all modifications which do not depart from the spirit and scope of this invention.

What is claimed is:

1. A method for obtaining submicron features from optical lithography technology comprising the steps of:
   depositing a first layer on a surface of a material to be etched, wherein the material to be etched and the first layer are not of the same material type;
   depositing a separating layer over said first layer;
   forming a resist layer on said separating layer;
   exposing said resist layer to act as a mask for etching through the separating layer and partially through said first layer;
   etching through the separating layer and partially through said first layer;
   removing said resist layer;
   depositing a second layer in said partially etched area of said first layer;
   anisotropically etching said second layer, leaving sidewalls in said partially etched area as a first mask;

completing etch through said first layer to form a second mask over said material to be etched, guided by said first mask; and thereafter etching a submicron trench in said material and removing the masks.

2. A method of claim 1 wherein the first layer is an organic material.

3. A method for obtaining submicron features from optical lithography technology comprising the steps of:

depositing an organic layer on a surface of a material to be etched;

depositing an oxide layer over said organic layer;

placing an optical resist layer over said oxide separating layer to act as a mask for etching through said oxide separating layer and partially through said organic layer to form a partially etched area;

etching through said oxide separating layer and partially through said organic layer to form a partially etched area;

removing said resist layer;

depositing an oxide layer over said partially etched area of said organic layer;

anisotropically etching said oxide layer leaving sidewalls as a first mask;

completing the etch through said organic layer to form a second mask over said material to be etched, guided by said first mask; and thereafter etching a submicron trench in said material and removing the masks.

* * * * *